United States Patent [19]

Wang

[11] Patent Number: 5,012,132
[45] Date of Patent: Apr. 30, 1991

[54] DUAL MODE HIGH VOLTAGE COUPLER

[75] Inventor: Ping Wang, Saratoga, Calif.

[73] Assignee: Xicor, Inc., Milpitas, Calif.

[21] Appl. No.: 417,594

[22] Filed: Oct. 5, 1989

[51] Int. Cl.$^5$ .................. H03K 3/01; H03K 17/56; H02M 3/18
[52] U.S. Cl. .................. 307/296.1; 307/296.2; 307/110; 307/240; 365/189.09; 365/226
[58] Field of Search .............. 307/296.6, 296.1, 296.2, 307/240, 110; 363/60; 365/189.09, 226

[56] References Cited

U.S. PATENT DOCUMENTS

| | | | |
|---|---|---|---|
| 4,274,012 | 6/1981 | Simko | 357/41 |
| 4,300,212 | 11/1981 | Simko | 365/185 |
| 4,314,265 | 2/1982 | Simko | 357/41 |
| 4,486,769 | 12/1984 | Simko | 357/41 |
| 4,829,482 | 5/1989 | Owen | 365/189.09 |
| 4,883,976 | 11/1989 | Deane | 307/296.2 |

FOREIGN PATENT DOCUMENTS 0026419 2/1977 Japan .

*Primary Examiner*—Stanley D. Miller
*Assistant Examiner*—Nam T. Nguyen
*Attorney, Agent, or Firm*—McCubbrey, Bartels, Meyer & Ward

[57] ABSTRACT

A dual mode high voltage coupler is described for enabling a low current capacity high voltage generator to supply high voltage to an output load, such as a row or word line in an EEPROM memory device during a nonvolatile write or erase operation. The coupler limits the amount of current to defective cells or rows in the memory without limiting current to the cells and rows that are operating normally. In a first mode, a single stage charge pump, including a storage capacitor driven by a periodic voltage signal, develops a metered current through a diode to the output load whose amplitude is equal to the product of the capacitance of the storage capacitor, the change in voltage across the capacitor in each cycle of said periodic signal and the frequency of said signal. In a second mode, said high voltage is coupled directly to said output load without limiting the current whenever the voltage across said load exceeds a predetermined value.

16 Claims, 2 Drawing Sheets

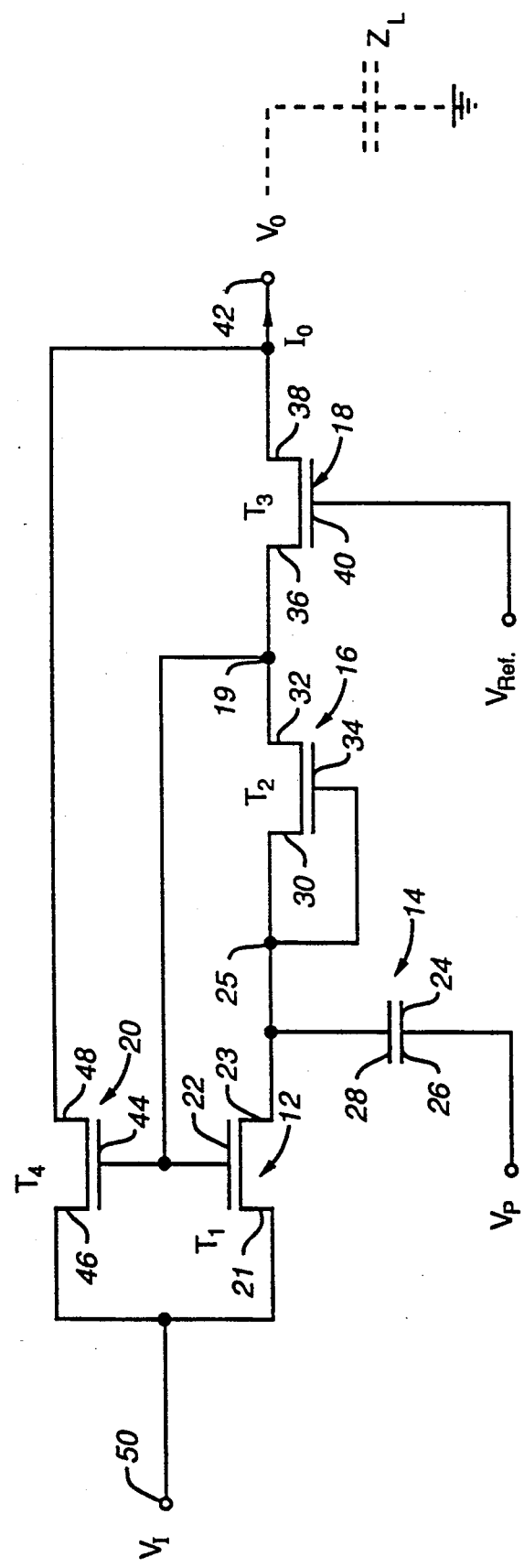
FIG._1

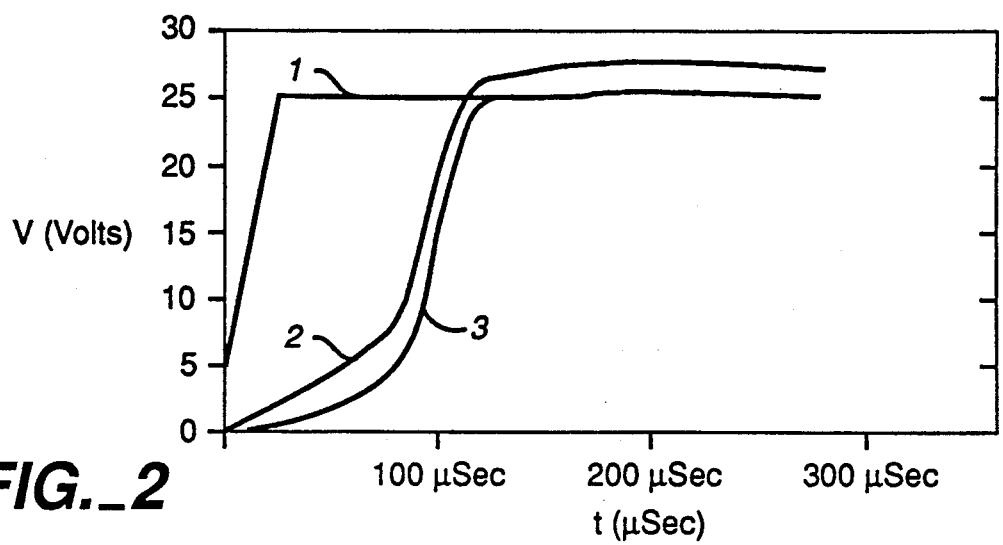
FIG._2
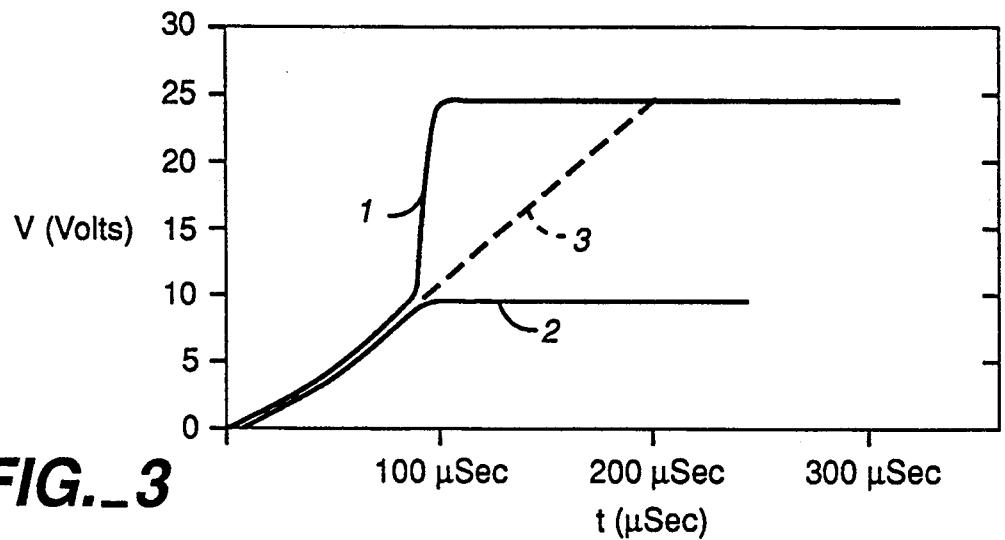
FIG._3
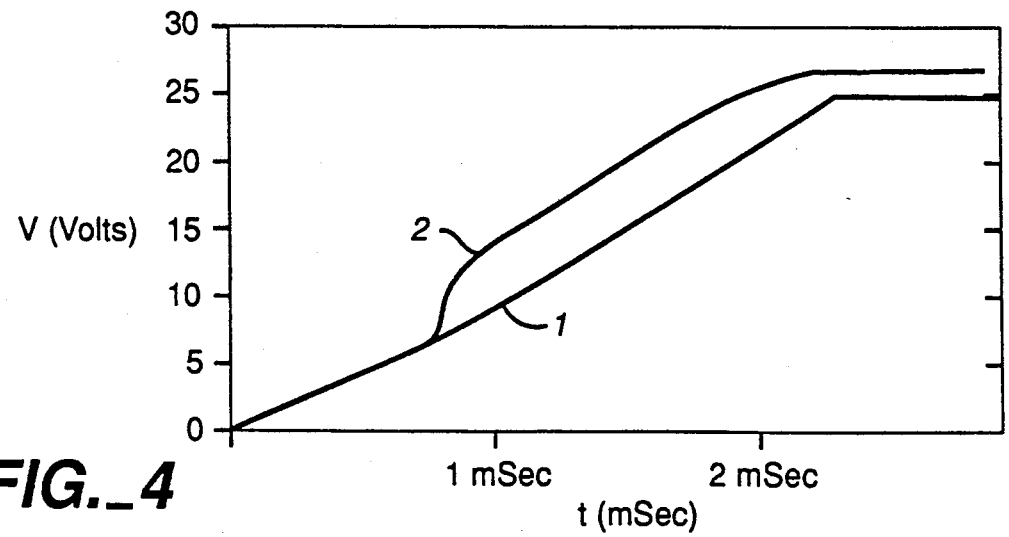
FIG._4

DUAL MODE HIGH VOLTAGE COUPLER

The present invention is directed to circuits which enable a low current capacity high voltage power source to drive one or more output loads, such as word lines in a memory array, and to prevent the loading down of the high voltage power source as the result of excess leakage current in a defective word line or the like.

BACKGROUND OF THE INVENTION

In one type of circuit element or device, hereinafter "tunneling device," electrons are caused to "tunnel" from a first conductor to a second conductor through an insulating dielectric separating the first and second conductors from each other. This effect is termed the Fowler-Nordheim field emission of electrons. This field emission of electrons occurs in response to a voltage difference across the dielectric by means of the application of different voltages to each conductor. When this voltage difference exceeds a threshold voltage, the Fowler-Nordheim field emission or tunneling of electrons is induced in the dielectric.

The tunneling device constitutes an unknown impedance to the applied voltage. When the voltage applied is less than the tunneling device's threshold voltage, the device acts primarily as a capacitive impedance, with charge accumulating on each conductor as the voltage increases across the dielectric. However, when the tunneling threshold voltage is exceeded, the tunneling of electrons occurs and current flows through the dielectric. Thus, above the tunneling threshold voltage, the input impedance of the tunneling device also has a resistive component.

An electrically erasable, programmable read only memory (EEPROM) and a nonvolatile random access memory (NOVRAM) are examples of integrated circuits which have tunneling devices. In each of these memories, there is a plurality of nonvolatile memory cells. In each cell, a polysilicon floating gate is totally surrounded by a dielectric, so that the charge state of the floating gate remains undisturbed for very long periods of time in the absence of voltages high enough to cause tunneling to occur. The charge level on the floating gate, i.e., the presence or absence of excess electrons, is used to represent a binary data state in the cell. Charge is applied to and removed from the floating gate through a programming tunneling region and an erase tunneling region, respectively, which are formed in the dielectric surrounding the floating gate. The position of each of these tunneling regions may be defined by a polysilicon layer which is positioned such that it overlaps a portion of the floating gate and is spaced from the floating gate a selected distance by the dielectric formed therebetween. See, for example, U.S. Pat. No. 4,274,012.

In one embodiment of the floating gate cell, electrons are introduced onto the floating gate, in a "programming" mode as follows. A low potential is applied to a programming electrode disposed adjacent to the dielectric forming the programming tunneling region and capacitively coupled to the floating gate. A high potential is applied to a bias electrode. The bias electrode is capacitively coupled to the floating gate such that the potential of the floating gate is elevated to the high potential. Therefore, a potential difference exists across the programming tunneling region. The applied low and high potentials are selected so that this potential difference exceeds the tunneling threshold of the dielectric in the programming region so that electrons are introduced by tunneling onto the floating gate.

Similarly, electrons are removed from the floating gate, in a "erase" mode, as follows. An erase electrode is disposed adjacent to the erase tunneling region and capacitively coupled to the floating gate. A low potential is applied to a bias electrode such that the floating gate is capacitively coupled to the low potential. Upon application of a sufficiently high potential to the erase electrode, a potential difference is developed across the dielectric in the erase tunneling region which exceeds the tunneling threshold voltage. Electrons are then removed from the floating gate by tunneling to the erase electrode.

An important feature of state of the art EEPROMS and NOVRAMS is that they be operable from a single external low voltage supply (e.g., 5 volts). Consequently, the high potentials or voltages necessary to program or erase a floating gate cell in such a memory must be generated using on-chip circuitry. This single external supply feature makes such memories much easier to use in most applications. However, generating the high voltages necessary for the nonvolatile program and erase operations using one or more on-chip high voltage generators greatly limits the amount of current that can be supplied to the non-volatile memory cell compared to the current that would be available if an external high voltage supply provided the high voltage power source. This is because a charge pump of reasonable size formed on the memory chip can only supply typically 10 to 40 microamps, whereas an external high voltage power source can easily supply several milliamps or more. Consequently, it is important for the operation of such on-chip power supplies to make sure that the various circuits which use the on-chip high voltages draw the minimum amount of current necessary for operation. If any such circuit were to draw a current in excess of a few tens of microamps, that circuit would pull down the high voltage charge pump output voltage, preventing the high voltage power source from attaining the voltage necessary to cause tunneling to occur and to successfully complete a nonvolatile write operation.

One prior art method for eliminating the problem of defective cells which excessively load down on-chip high voltage generators is to incorporate on-chip redundancy. Such redundancy also increases yield and reduces costs in large EEPROM chips. By adding a few extra rows or columns to the array and adding special circuitry in the decoder, a defective bit or row or column can be replaced during testing of the chip with a good redundant row or column to make a fully functional part. It is particularly convenient and inexpensive to adapt redundancy to an EEPROM since EEPROM cells can be used to permanently retain the addresses of the defective rows or columns that are being replaced by good redundant rows or columns.

However, if the memory device includes a mass program or mass erase capability, all of the rows in the array including the redundant rows and the rows containing defective cells are coupled to the on-chip high voltage generator during such an operation. The mass mode capability is an important functionality for a memory device since it significantly reduces the time required to test the memory device as the entire array of cells can be erased or programmed in one high voltage store operation, which typically takes about 5 or 10 milliseconds. This is in contrast to the several seconds it takes to write a large EEPROM in a page write mode where each page takes about 5 to 10 milliseconds to write and where, for example, there are 256 or 512 pages. The mass mode feature is also useful in applications where data security is important and the user needs to quickly remove all of the data in the EEPROM. Thus, it is even more important in such a memory device that means be provided for coupling the high voltage to each cell in a manner in which the current to each row line is limited or controlled to prevent a shorted or leaky cell from holding down the high voltage generator. However, to avoid current limiting to good cells, since it is not needed or desirable, a high voltage coupler having a dual mode is needed to limit current to rows with defective bits but not to rows that operate normally.

SUMMARY OF THE INVENTION

It is therefore an object of the present invention to provide a novel dual mode high voltage coupler for supplying high voltages to a row or word line in a memory device such as an EEPROM during a nonvolatile program or erase operation which limits the amount of current to defective cells or rows in the memory without limiting current to the cells and rows or columns that are operating normally.

A further object of the present invention is to provide a dual mode high voltage coupler which enables a memory device which has byte or page mode write capability to also have mass mode write capability in arrays where known or unknown defective cells may exist.

Still another object of the present invention is to enable a low current capacity high voltage power source to drive one or more output loads of unknown impedance, such as word lines in a memory array, and to prevent the loading down of the high voltage power source as the result of excess leakage current in a defective word line or the like.

Another object of the present invention is to provide a novel dual mode high voltage coupler which is easily integratable into known integrated circuit nonvolatile memory devices or the like.

According to the present invention, a dual mode high voltage coupler is responsive to an input voltage to operate in a first mode for developing a predetermined level of metered output current for application to a load having an unknown impedance and to operate in a second mode for causing the direct coupling of said input voltage to said load. The coupler includes means responsive to the present voltage across said load for coupling a predetermined constant metered current to said load independent of the impedance of said load so long as said voltage across said load is equal to or less than a predetermined value, and means for coupling said input voltage directly to said load whenever said voltage across said load is greater than said predetermined value.

Further according to the present invention, the dual mode high voltage coupler more specifically includes means for developing a first voltage from said input voltage as a function of the present voltage across said load, means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state, means for coupling said portion of said charge to said load to supply said metered output current when said present voltage across said load is equal to or less than a predetermined value, and means for decoupling said coupling means from said load and for coupling said input voltage directly to said load when said present voltage across said load is above said predetermined value.

For example, in one embodiment of the present invention, the storing means includes a storage capacitor. A periodic signal is applied to a first plate of this storage capacitor. When the periodic signal is in its low state, the above described first voltage is applied to the second plate of the storage capacitor to store charge thereon. The first voltage is developed to be substantially equal to the present output voltage across the load. When the periodic signal goes high, the second plate is capacitively coupled high and becomes coupled to the load through a diode connected transistor. Hence, during the transition between the low state and the high state of the periodic signal, the voltage on the second plate of the capacitor remains substantially equal to the present voltage across the load. However, the voltage at the first plate is elevated by the peak-to-peak voltage of the periodic signal. Thus, the change of voltage, delta V, across the capacitor is approximately equal to the peak-to-peak voltage of the periodic signal. Furthermore, this change of voltage will cause some of the charge to be discharged to the load as the output current, $I_O$. Mathematically, the output current $I_O$ is given by the equation $I_0 = CF$ delta V, where C is the capacitance of the storage capacitor and F is the frequency of the periodic signal. Since each of these factors are constant, as well as delta V, the output current developed on each high state of the periodic signal will also have a constant amplitude.

The dual mode high voltage coupler according to the present invention is preferably connected between the high voltage generator and each row or column of the memory device. Its purpose is to isolate the high voltage generator from the row or column whenever the row or column impedance is such that too much leakage current would be sunk through the row or column. That is, the dual mode coupler functions to prevent a defective row in a memory array (the unknown impedance variable) from preventing the high voltage generator from going to its proper level. If the word line output impedance has a current leakage which causes the voltage on the output word or column line to not exceed a predetermined level, the high voltage coupler according to the present invention remains in the current metered mode and no more than the predetermined constant output current will be coupled to the word line. If the word line voltage exceeds a predetermined level, this indicates that the output impedance of the word line is high enough that the on-chip high voltage generator can be coupled directly to the word line without loading down the high voltage generator excessively.

The dual mode coupler according to the present invention performs its dual mode operation by including a switch which changes state when the output voltage on the word line or the like exceeds the above mentioned predetermined value. The non-current limiting mode is enabled in the high voltage coupler at that point. Once the voltage on the output word line or the like exceeds this voltage, the current metering function of the high voltage coupler is bypassed using a second switch and the high voltage generator voltage output is coupled directly through an MOS transistor to the output word line or the like. Thus, once the high voltage coupler according to the present invention has determined that the impedance of the load is above a certain minimum determined by the voltage appearing on the load, it disables the current metering aspect of the high voltage coupler and enables the voltage generated by the high voltage generator to be coupled directly to the word line or the like.

These and other advantages, objects and features of the present invention will become more apparent from the following specification when read in conjunction with the accompanying drawings and the appended claims.

BRIEF DESCRIPTION OF THE DRAWINGS

FIG. 1 is a schematic diagram of a novel dual mode high voltage coupler according to the present invention;

FIG. 2 is a graph of the response characteristics of the coupler of FIG. 1 to an input voltage having a rise time that is rapid as compared with the operation of said coupler;

FIG. 3 is a graph of the voltage appearing on the word line as a function of time for two dual mode high voltage couplers according to the present invention, one of which is connected to a normally operating row line and the other of which is connected to a defective row line; and FIG. 4 is a graph of the response characteristics of the coupler of FIG. 1 to an input voltage having a rise time that is slow as compared with the operation of said coupler.

DETAILED DESCRIPTION OF THE PREFERRED EMBODIMENTS

Referring now to FIG. 1, there is shown one embodiment of a dual mode high voltage coupler 10 according to the present invention. The dual mode high voltage coupler 10 develops an output current $I_O$ in response to an unknown input high voltage $V_I$. The output current $I_O$ develops a voltage $V_O$ across a load $Z_L$ having an unknown impedance. As will be described in greater detail below, the dual mode high voltage coupler 10 develops the output current $I_O$ in a first mode that is independent of the level of the input voltage $V_I$ as long as $V_I$ is equal to or greater than $V_O$, and this current is also independent of the impedance of the load. In a second mode of the high voltage coupler 10, the circuit bypasses the current metering function described above and enables the input voltage $V_I$ to be coupled directly out to the output load $Z_L$ such that the output current $I_O$ is no longer metered.

In the first mode, the high voltage coupler 10 includes means 12 for developing a first voltage on node 25 from the input voltage $V_I$ as a function of the present voltage $V_O$ across the load, and means 14 for storing a quantum of charge as a function of the first voltage. The storing means 14 is responsive to a periodic signal $V_P$ having a first state and a second state. When the periodic signal $V_P$ is in the first state, the quantum of charge is stored in storing means 14. The storing means 14 is further responsive to the second state of the periodic signal $V_P$ for discharging a portion of the stored charges as a function of the peak-to-peak voltage of the periodic signal $V_P$.

In the first mode, the high voltage coupler 10 further includes means 16 for coupling the discharged portion of the charge to the load. Since the stored charge is a function of the present load voltage $V_O$ and the discharged portion thereof is a function of the peak-to-peak voltage of the periodic signal $V_P$, the output current developed will have a constant level.

Switch means 18 is turned on in the first mode as the input voltage $V_{Ref}$ is higher than the output voltage $V_O$, which enables the output current from means 16 to be coupled out as the output current $I_O$ of the high voltage coupler 10.

The second mode begins when the output $V_O$ exceeds $V_{Ref}$ minus the threshold voltage of switch means 18. At this point, switch means 18 turns off enabling means 12 and storing means 14 to act as a charge pump in response to periodic signal $V_P$ to cause a node 19 to charge up to a voltage higher than the input high voltage $V_I$ by approximately the peak-to-peak voltage of the periodic signal. A second mode coupling means 20 responsive to the voltage on node 19 and switch means 18 then turns on and couples the input high voltage $V_I$ directly to load $Z_L$.

The average metered current pumped by means 12, means 14 and means 16 is equal to $I=FC(V_{P-P}-2V_T)$ where F is the frequency of the periodic signal $V_P$, $V_T$ is the threshold voltage of means 12 and means 16, $V_{P-P}$ is the peak-to-peak voltage of periodic signal $V_P$, and C is the capacitance of means 14.

In one particular example, where F is about 300 KHz, C is about 0.1 picofarads, $V_T$ is about 1 V, and $V_{P-P}$ is about 8 V, the metered current is about 180 nA. Thus, if the predetermined voltage $V_{Ref}$ is set at 9 volts, the coupler 10 will switch over to the second mode when $V_O$ reaches about 8 volts, which means the maximum load that will be coupled directly to the on-chip charge pump in the second mode would have a resistance of about 8V/180 nA = 44 Meg ohms. Thus at 25 volts, this word line would draw a maximum current of 568 nA, which can be supplied by the on-chip charge pump.

In other words, if the leakage current $I_{Leak}$ being drawn by the word line is less than this metered current I of 180 nanoamps, the coupler 10 according to the present invention will switch to its non-metered mode, as described above, at a predetermined voltage developed across the output load, and the high voltage generator will be able to supply this amount of leakage current $I_{Leak}$. However, where the leakage current $I_{Leak}$ is equal to or greater than this current of 180 nanoamps, the output voltage $V_O$ will not be able to rise above a certain level sufficient to shut off switch means 18. Thus, the maximum current supplied to the word line load, where a defect exists on the word line, is limited to the metered current I of 180 nanoamps.

Referring in greater detail to the preferred embodiment of the dual mode high voltage coupler 10 according to the present invention, as shown in FIG. 1, the current metering portion of the circuit 10 includes the developing means 12, the storing means 14, and the means 16 for coupling the discharge portion of the charge to the load.

The developing means 12 includes a first transistor $T_1$ having a drain 21, a source 23 and a gate 22. The storing means 14 includes a storage capacitor 24 having a first plate 26 and a second plate 28. The periodic signal $V_P$ is applied to the first plate 26. The second plate 28 is coupled to the source 23 of the first transistor $T_1$. The coupling means 16 includes a second transistor $T_2$ having a drain 30, a source 32 and a gate 34. The drain 30 and the gate 34 of the second transistor $T_2$ are connected to each other and to the second plate 28 of the storage capacitor 24. The source 32 of the second transistor $T_2$ develops the output current $I_O$ for application to the load via transistor $T_3$, which stays on during the current metering mode operative state of the high voltage coupler 10.

The input voltage $V_I$ is applied to a node 50 of coupler 10 and thereby to the drain 21 of the first transistor $T_1$. The present output voltage $V_O$ in the first or current metering node is applied to the gate 22 of the first transistor $T_1$ via a transistor $T_3$, described in greater detail below, which is on during the current metering mode operative state of the high voltage coupler 10. When the periodic signal $V_P$ goes low to its first state, capacitive storing means 14 capacitively couples the source 23 of the first transistor $T_1$ low, which causes transistor $T_1$ to turn on. This holds the voltage at source 23 at 1 $V_T$ below $V_O$.

When the periodic signal $V_P$ goes high to its second state, the second plate 28 of capacitor 24 is capacitively coupled high, which turns off transistor $T_1$ and turns on the second transistor $T_2$ so that the discharged portion of the stored charge is coupled to the load $Z_L$ via transistor $T_3$. Since the gate 34 and drain 30 of the second transistor $T_2$ are coupled to each other, the second transistor acts as a diode with a forward voltage drop of 1 $V_T$ between the second plate 28 of the storage capacitor 24 and the load, so long as $T_3$ remains on. As described in greater detail below, the second state of the periodic signal $V_P$ elevates the voltage at the first plate 26 of the storage capacitor 24. This also elevates the voltage of the second plate 28 of the storage capacitor 24 to achieve the diode action of the second transistor $T_2$.

More specifically, in the first mode, when the periodic signal $V_P$ goes low, i.e., in its first state, the storage capacitor 24 is charged by the voltage appearing at its second plate 28. This voltage is determined by the source 23 of the first transistor $T_1$ So long as the input voltage $V_I$ is greater than or equal to $V_O$, when the first transistor $T_1$ is turned on, the maximum voltage that can appear at its source 23 is equal to the voltage $V_O$ across the load less the turn on threshold voltage $V_T$ of the first transistor $T_1$. When the periodic signal $V_P$ goes low to its first state, the source 23 of the first transistor $T_1$ is capacitively coupled low, which turns on transistor $T_1$ and holds the second plate 28 of storage capacitor 24 at a voltage $V_C$ equal to the voltage $V_O$ across the load less the turn on threshold voltage $V_T$ of the first transistor $T_1$, or $V_C = V_O - V_T$. Thus, the first voltage, i.e., the voltage developed by the source 23 of the first transistor $T_1$, is substantially equal to the present voltage $V_O$ across the output load minus 1 $V_T$.

When the periodic signal $V_P$ goes high to its second state in the first mode, the voltage at the source 23 of the first transistor $T_1$ is capacitively coupled high causing the first transistor $T_1$ to turn off and the second transistor $T_2$ to turn on. After the second transistor $T_2$ turns on, the voltage at the second plate 28 of the storage capacitor 24 cannot exceed the voltage $V_O$ across the load plus the threshold voltage $V_T$ of the second transistor $T_2$ because of the diode effect of the second transistor $T_2$. Therefore, the capacitor 24 must discharge a portion of the quantum of charge stored thereon. This discharge portion of the charge is coupled through the second transistor $T_2$ and the third transistor $T_3$ to develop the output current $I_O$. As described above, the output current $I_O$ can be expressed as:

$$I_O = CF \text{ delta } V$$

where delta V is the peak-to-peak voltage of the periodic signal $V_P$ less the threshold voltages of the transistors $T_1$ and $T_2$, F is the frequency of the periodic signal $V_P$ and C is the capacitance of the storage capacitor 24.

Switch means 18 comprises a transistor $T_3$ having a drain 36, a source 38 and a gate 40. The source of transistor $T_2$ is connected to a node 19 to which the drain 36 of transistor $T_3$ is connected. The source 38 of transistor $T_3$ is connected to node 42 to which the output load $Z_L$ is coupled. As mentioned above, transistor $T_3$ acts as a switch means for switching the high voltage coupler 10 according to the present invention from a first current metering mode to a second directly coupled and non-current metering mode when it has been determined that the impedance of the load is above a predetermined value. This functionality is provided by coupling a voltage reference $V_{Ref}$ to the gate 40 of transistor $T_3$. If the output load voltage $V_O$ rises above a predetermined voltage equal to $V_{Ref}$ minus the threshold voltage $V_T$ of transistor $T_3$, transistor $T_3$ will turn off. Once transistor $T_3$ turns off, the current metering current described above is no longer coupled out to output node 42 and load $Z_L$.

When transistor $T_3$ is turned off, signifying the beginning of the direct coupling mode, the charge generated by the operation of transistors $T_1$, $T_2$, storage capacitor 24 and the periodic signal $V_P$ begins to charge up node 19 since it is no longer coupled to output node 42. Node 19 will continue to charge up to $V_{P-P}$ minus 2 $V_T$ higher than the input voltage $V_I$. This voltage is applied to the gate 44 of a transistor $T_4$, thereby turning on transistor $T_4$. Transistor $T_4$ further includes a drain 46 and a source 48. Drain 46 is coupled to the input node 50 and input voltage $V_I$. Source 48 of transistor $T_4$ is connected to node 42 and the output load $Z_L$. Thus, when the voltage on the gate 44 of transistor $T_4$ exceeds one threshold above the voltage $V_I$, transistor $T_4$ turns on and remains on as $V_I$ goes up in magnitude, which couples directly the high voltage $V_I$ input on node 50 to the output load at node 42. The above thus comprises means responsive to the turning off of transistor $T_3$, i.e., responsive to the state of mode switch means 18, for coupling the input voltage $V_I$ directly to the output load $Z_L$ via transistor $T_4$.

Referring to FIG. 2, shown is a graph of the response characteristics of coupler 10 as a function of an input voltage $V_I$ whose rise time is rapid as compared with the response of the coupler circuitry. Curve 1 illustrates the rise time of the input voltage, which starts at approximately 5 volts and goes up to approximately 25 volts. Curve 2 illustrates the voltage level on node 19. As can be seen, at approximately an output voltage $V_O$ of 9 volts, the voltage on node 19 rapidly rises to about 6 volts over the level of input voltage $V_I$, which is equal to the peak-to-peak voltage of periodic signal $V_P$, to cause transistor $T_4$ to turn on. Curve 3 illustrates the output voltage $V_O$ first during the current metering mode of coupler 10 and then during the direct coupling mode.

Referring now to FIG. 3, there is shown a graph of the operation of the dual mode high voltage coupler 10 according to the present invention. As seen in FIG. 3, the vertical axis of this graph is the voltage $V_O$ of the word line, or the like, and the horizontal axis is time in increments of 100 microseconds. Curve 1 illustrates the operation of the dual mode high voltage coupler 10 according to the present invention. As seen in Curve 1, until approximately 80 microseconds has elapsed, the high voltage coupler 10 operates in a current metering mode wherein the output current to the load $Z_L$ is regulated or metered to average a constant value. At 80 microseconds, the voltage $V_O$ of the output begins to exceed approximately 8 volts. At this point, as determined by a voltage $V_{Ref}$ of about 9V, transistor $T_3$ switches off, and node 19 charges up rapidly to about 26 or 27 volts. This turns on transistor $T_4$, thereby coupling the input high voltage $V_I$ directly to the output node 42 to thus comprise $V_O$. As can be seen in Curve 1, the voltage coupled to load $Z_L$ then continues to rise to about 25 or 26 volts, a level which enables normal operation of the program or erase operation of the memory device to occur.

Curve 2 illustrates the situation where the word line to which the coupler 10 is connected is defective. According to the present invention, when the leakage current $I_{Leak}$ is sufficient to exceed the current generating capacity of the current metering portion of the high voltage coupler 10, described above the output voltage $V_O$ will not rise above a certain voltage, e.g. 8 volts. As a result, transistor $T_3$ remains on and the constant current provided by the current metering portion of coupler 10 remains the maximum current coupled out to the load $Z_L$. Thus, the output voltage $V_O$ stays at this lower voltage level. The high voltage generator input voltage $V_I$ is thus kept isolated from the output load node 42 whenever the leakage current $I_{Leak}$ exceeds a predetermined maximum. As a result, the operation of the high voltage coupler 10 according to the present invention prevents the high voltage generator from being loaded down by a defective word line, or the like.

Curve 3, shown in phantom, illustrates the condition where the voltage $V_{Ref}$ is set arbitrarily high, such as at 25 volts, so as to maintain the coupler 10 in a current metering mode for all input voltage $V_I$ values.

Referring now to FIG. 4, shown is a graph of the response characteristics of the coupler 10 as a function of an input voltage $V_I$ whose rise time is slow with respect to the operation of the coupler circuitry. Curve 1 illustrates the operation of both the input voltage $V_I$ and the output voltage $V_O$ as a function of time. When driving a normal word line in an EEPROM, for example, the output voltage will approximately follow the input voltage both in the current metering mode of coupler 10 and in the direct coupling mode. Curve 2 illustrates the voltage on node 19 as the input voltage rises. As can be seen, when transistor $T_3$ turns off, node 19 rapidly charges up to a voltage about 6 volts higher than $V_I$ to cause transistor $T_4$ to turn on hard.

To deselect the high voltage coupler 10, the output voltage $V_O$ is clamped at 0 volts. This prevents transistor $T_1$ from turning on and, if capacitor 24 is made by an enhancement device and the low state of periodic signal $V_P$ is also equal to 0 volts, no current will be drained from the high voltage generator through coupler 10 in this deselect mode.

To discharge the charge stored on the output word line, when the output word line is at a higher voltage than $V_{Ref}$ minus one threshold voltage $V_T$, the voltage on $V_I$ is lowered with the periodic signal operating, which keeps transistor $T_4$ turned on. With transistor $T_4$ on, the voltage on the output word line will follow the voltage $V_I$. If the output word line was defective and its voltage never rose above $V_{Ref}$ less one $V_T$, or whenever $V_O$ goes below $V_{Ref}$ minus one $V_T$, transistor $T_3$ turns on, which couples the gate of transistor $T_4$ to $V_O$, after which transistor $T_4$ functions as a diode to $V_I$, to discharge the output word line to $V_I$. Thus, the output word line is enabled to discharge when the voltage $V_I$ on node 50 is lowered.

Although the present invention has been described above utilizing n-channel technology, it is within the ordinary skill of the art to use p-channel technology. In this regard, the voltages described above would be opposite in polarity. Also, the devices disclosed in conjunction with the present invention are compatible with various integrated circuit technologies such as CMOS (including CMOS/SOS) and bipolar integrated circuit designs, and may be used in integrating circuits incorporating CMOS and bipolar elements. While various other aspects of the present invention have been described with reference to a specific embodiment thereof, it will be appreciated that other variations, uses and modifications to the present invention may be made without departing from the inventive concepts described herein. Accordingly, the present invention is to be limited solely by the scope of the appended claims.

What is claimed is:

1. A dual mode high voltage coupler responsive to an input voltage having a first mode for developing a predetermined level of metered output current for application to a load having an unknown impedance and a second mode for causing the direct coupling of said input voltage to said load, said coupler comprising:

means responsive to the present voltage across said load for coupling a predetermined metered current to said load independent of the impedance of said load so long as said voltage across said load is equal to or less than a predetermined value; and means for coupling said input voltage directly to said load whenever said voltage across said load is greater than said predetermined value.

2. The high voltage coupler as set forth claim 1 wherein said means for coupling a predetermined current to said load independent of the impedance of said load comprises:

means for developing a first voltage from said input voltage as a function of the present voltage across said load;

means response to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state; and means for coupling said portion of said charge to said load to develop said metered output current.

3. The high voltage coupler as set forth in claim 1 wherein said means for coupling said input voltage directly to said load comprises switch means responsive to said predetermined value of said output voltage for decoupling said predetermined metered current from said load and for coupling said input voltage directly to said load.

4. A dual mode high voltage coupler responsive to an input voltage having a first mode for developing a predetermined level of metered output current for application to a load having an unknown impedance and a second mode for causing the direct coupling of said input voltage to said load, said coupler comprising:

means for developing a first voltage from said input voltage as a function of the present voltage across said load;

means responsive to a periodic signal having a first state and a second state for storing a quantum of charge as a function of said first voltage when said periodic signal is in said first state and for discharging a portion of said charge as a function of the peak-to-peak voltage of said periodic signal when said periodic signal is in said second state;

means for coupling said portion of said charge to said load to supply said metered output current when said present voltage across said load is equal to or less than a predetermined value; and means for decoupling said coupling means from said load and for coupling said input voltage directly to said load when said present voltage across said load is above said predetermined value.

5. The high voltage coupler as set forth in claim 4 wherein said developing means includes a transistor having a drain, a source and a gate, said input voltage being applied to said drain, the present voltage across said load being coupled to said gate, said source developing said first voltage when said quantum of charge is being stored.

6. The high voltage coupler as set forth in claim 5 wherein said first voltage is substantially equal to the present voltage across said load during said first mode.

7. The high voltage coupler as set forth in claim 5 wherein said transistor is an enhancement mode transistor.

8. The high voltage coupler as set forth in claim 4 wherein said storing means includes a capacitor having a first plate and a second plate, said periodic signal being applied to said first plate, said first voltage being applied to said second plate.

9. The high voltage coupler as set forth in claim 4 wherein said charge coupling means includes a transistor having a drain, a source and a gate, said portion of said charge being discharged to said drain and said gate of said transistor, said source being coupled to said load.

10. The high voltage coupler as set forth in claim 9 wherein said transistor is an enhancement mode transistor.

11. The high voltage coupler as set forth in claim 4 wherein said charge coupling means includes a diode connected to said charge storing and discharging means and switch means connected between said diode and said load, said switch means having a first conductive state when the present voltage across said load is equal to or less than said predetermined value and a second non-conductive state when the present voltage across said load exceeds a predetermined value.

12. The high voltage coupler as set forth in claim 11 wherein said switch means includes a transistor having a drain, a source and a gate, the present voltage across said load being coupled to said source, said drain being coupled to said diode means and a predetermined reference voltage being coupled to said gate, such that said transistor is conductive until the voltage across said load exceeds said predetermined value.

13. The high voltage coupler as set forth in claim 12 wherein said transistor is an enhancement mode transistor.

14. A dual mode high voltage coupler responsive to an input voltage having a first mode for developing a predetermined level of metered output current for application to a load having an unknown impedance and a second mode for causing unmetered output current to be applied to said load, said coupler comprising:

a capacitor having a first plate and a second plate;

means for applying a periodic signal having a first state and a second state to said first plate;

a first transistor having a gate, a source and a drain, said source being coupled to said second plate, said input voltage being coupled to said drain;

switch means for coupling the present voltage across said load to the gate of said first transistor during said first mode, said first transistor being conductive during said first state of said periodic signal to develop a first voltage at said source as a function of said present voltage across said load and to store a quantum of charge on said capacitor as a function of said first voltage, and non-conductive during said second state of said periodic signal;

a second transistor having a gate, a source and a drain, said drain and said gate of said second transistor being coupled to said second plate, said source of said second transistor being coupled to said switch means, said second transistor being nonconductive during said first state of said periodic signal and conductive during said second state of said periodic signal, the voltage of said first plate being elevated by the peak-to-peak voltage of said periodic signal to turn on said second transistor to discharge a portion of said charge as a function of the peak-to-peak voltage of said periodic signal, said portion of said charge being coupled through said second transistor to develop said metered output current during said first mode;

said switch means including a third transistor having a gate, a source, and a drain, the drain of said third transistor being coupled to the source of said second transistor and to the gate of said first transistor, said gate of said third transistor being coupled to a voltage reference, and said source of said transistor being coupled to said load; and a fourth transistor having a gate, a source and a drain, said drain of said fourth transistor being coupled to said input voltage, said source of said fourth transistor being coupled to said load, and said gate of said fourth transistor being coupled to the drain of said third transistor, said switch means during said second mode causing said input voltage to be coupled through said fourth transistor to said load when the present voltage on said load exceeds a predetermined value.

15. An apparatus for compensating for defects in an array of output loads to enable a voltage generator with limited current capacity to generate an input voltage that is coupled directly to operating loads of an impedance greater than a predetermined value while at the same time limiting the maximum current coupled to loads having an impedance equal to or lower than said predetermined value, comprising:

a coupler means connected between said voltage generator and each said load, each said coupler responsive to said input voltage for developing a predetermined level of metered output current for application to said load responsive to the present voltage across said load so long as said voltage across said load is equal to or less than a predetermined value and for causing the direct coupling of said input voltage to its said corresponding load whenever said voltage across said load is greater than said predetermined value.

16. A method for compensating for defects in an array of output loads to enable a voltage generator with limited current capacity to generate a voltage that is coupled directly to normally operating loads of an impedance greater than a predetermined value while at the same time limiting the maximum current coupled to loads having impedance equal to or less than the predetermined value comprising the steps of:

coupling a metered current to each said load so long as the voltage across said load is equal to or less than a predetermined value; and coupling said input voltage directly to each said load whenever the voltage across said load is greater than said predetermined value.

* * * * *